United States Patent [19]
Skerlos et al.

[11] 4,426,662
[45] Jan. 17, 1984

[54] IR REMOTE CONTROL DETECTOR/DECODER

[75] Inventors: Peter C. Skerlos, Arlington Hts.; Thomas J. Zato, Palatine, both of Ill.

[73] Assignee: Zenith Radio Corporation, Glenview, Ill.

[21] Appl. No.: 340,555

[22] Filed: Jan. 18, 1982

[51] Int. Cl.³ ............................................. H04B 9/00
[52] U.S. Cl. ................................ 358/194.1; 455/603; 455/619
[58] Field of Search ................... 358/194.1; 455/603, 455/607, 608, 619

[56] References Cited

U.S. PATENT DOCUMENTS

| | | |
|---|---|---|
| 3,866,177 | 2/1975 | Kawamata et al. |
| 3,928,760 | 12/1975 | Isoda . |
| 4,121,198 | 10/1978 | Tsuboi et al. . |
| 4,231,031 | 10/1980 | Crowther ............................ 455/603 |
| 4,246,611 | 1/1981 | Davies ............................ 358/194.1 |
| 4,337,480 | 6/1982 | Bourassin ........................ 358/194.1 |

OTHER PUBLICATIONS

Microcomputer-Based Remote Control System for TV Receivers Tsuboi et al, IEEE Trans Consum Electronics vol.-CE-25 No. 5 Nov. 1979, pp. 731-740.

Primary Examiner—Michael A. Masinick

[57] ABSTRACT

A pulse code modulated (PCM) infrared (IR) remote control detector/decoder with improved noise immunity particularly adapted for use with a television receiver is disclosed. The IR pulses are modulated by means of a high frequency clock signal in translating the transmitted signal to a higher frequency, more noise immune portion of the IR spectrum. After receipt of the transmitted signal by a signal detector, the high frequency modulation is removed from the pulses which are then decoded. Under the control of a microcomputer, the decoder looks for the start data bit and, if received, the subsequent control instructions. When the data transmission has been decoded, the microcomputer activates the appropriate control outputs to the television receiver's tuner system to achieve the desired control function.

7 Claims, 16 Drawing Figures

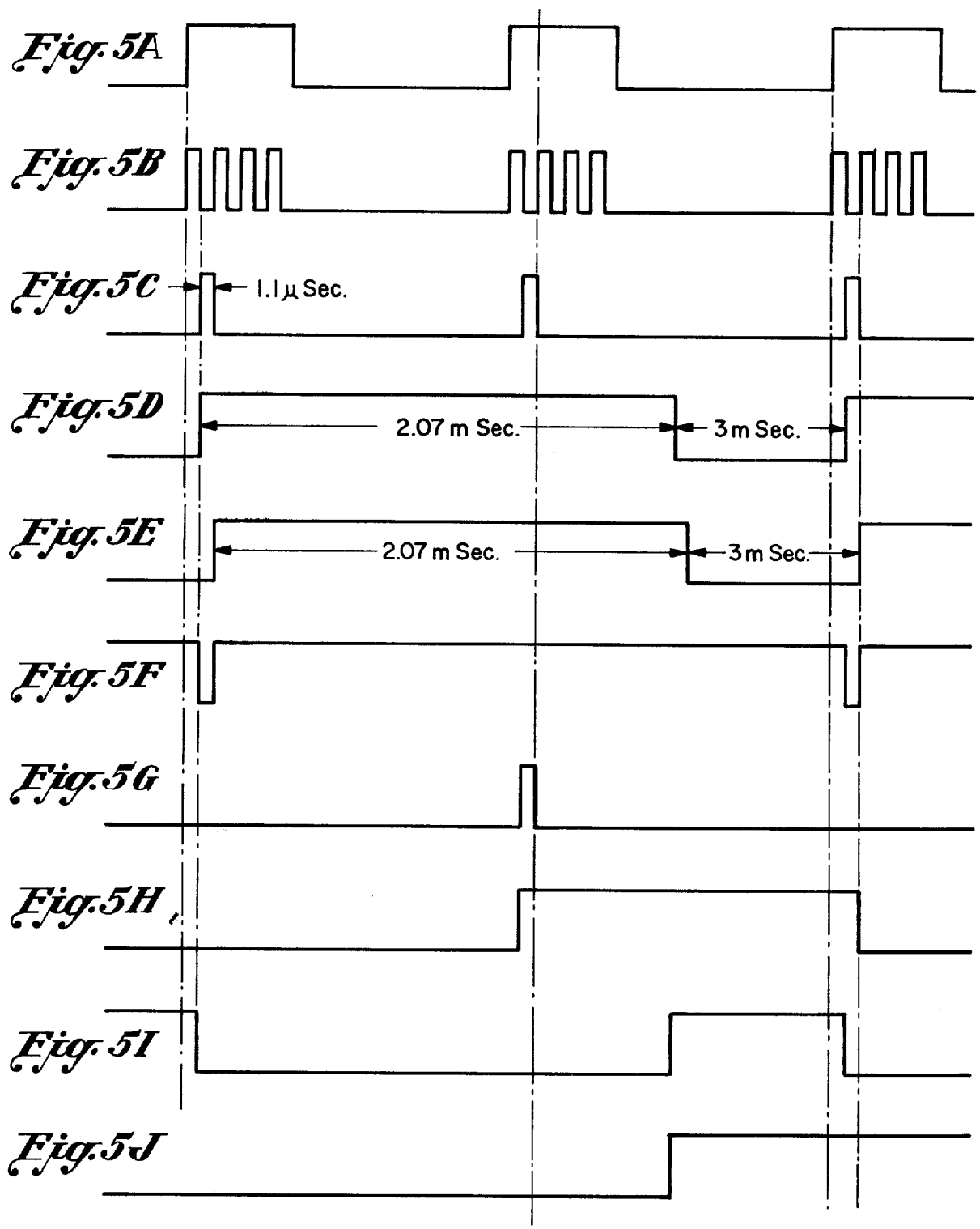

IR REMOTE CONTROL DETECTOR/DECODER

BACKGROUND OF THE INVENTION

This invention generally relates to remote control receivers and more specifically is directed to an infrared (IR) remote control detector/decoder providing improved noise immunity particularly adapted for use with a television receiver.

Television receiver remote control systems generally employ either an ultrasonic or optical link. Spurious signal problems associated with ultrasonic remote control systems, such as multi-path reception, telephone ringing, key jangling, etc., limit the practicality of these systems for home use and have led to wider use of IR remote control systems. However, even systems utilizing signals propagated in the IR spectrum suffer from spurious inputs resulting in control signal input errors.

One approach to reducing erroneous inputs in a remote control system in which light signals are used as the remote control signal is disclosed in U.S. Pat. No. 3,928,760 to Isoda. This approach utilizes a light signal emitted from an electroluminescent diode which is amplitude-modulated by a modulated frequency in the ultrasonic frequency range. By thus amplitude modulating a light signal at an ultrasonic frequency, ambient noise in the ultrasonic frequency spectrum, such as that previously described, is allegedly avoided. In addition, it is asserted that by modulating the light signal at a relatively high frequency, amplitude-modulated light noise generated by various sources, such as fluorescent lamps, is avoided.

An extension of the approach employed in the above referenced patent is disclosed in U.S. Pat. No. 3,866,177 to Kawamata et al wherein is disclosed a remote control system using light as a controlling signal which is first modulated by a high frequency signal and is then further modulated with a low frequency signal. The received light signal is demodulated to pick up the low frequency component which serves as the control signal. The purpose of this high and low frequency modulation of the remote control light signal is to avoid spurious inputs generated by DC energized fluorescent lamps in which the DC current is transformed into a high frequency current of 15 kHz to several tens kHz by a high frequency inverter and energizes the lamp thereby. The high frequency signal thus generated is frequently not stable further reducing the desirability of a light signal remote control system modulated at a high frequency.

In an attempt to make the remote control system more noise immune, the control signal is propagated in the form of various combinations of pulses of a single frequency wave. With the number of pulses being preset in the transmitter and with the receiver responsive to only a predetermined number of pulse arrangements, such remote control systems proved to be not only more noise immune, but also capable of transmitting a large number of commands for controlling various functions of a television receiver. However, even with the use of complex pulse code schemes, remote control systems utilizing this approach offer only limited noise immunity.

U.S. Pat. No. 4,121,198 to Tsuboi et al represents an attempt to further improve the noise immunity of a pulse code modulation remote control system. In this approach a coded command signal transmitted as a plurality of pulses of a first frequency $F_1$ also includes additional pulses of a second frequency $F_2$ inserted in spaces between the pulses of the first frequency. System noise immunity is allegedly improved by making the receiver insensitive to noise received during the inter-pulse periods. However, this approach requires the use of sophisticated pulse processing circuitry because two pulse frequencies are utilized and is limited in the number of pulse codes available since one half of the available pulse codes must be devoted to filling in the spaces between the control signal pulses operating at a frequency of $F_1$.

The present invention is intended to overcome the aforementioned limitations of the prior art by providing a remote control system in which a pulse code modulated control signal is used to modulate a second signal so as to transmit the control signal in a more noise free portion of the IR spectrum. The pulse code modulation (PCM) approach provides for an increased number of available codes and associated television receiver control functions.

OBJECTS OF THE INVENTION

Accordingly, it is an object of the present invention to provide an improved remote control signal detector/decoder.

It is another object of the present invention to provide an IR signal detector/decoder with improved noise immunity for use in the remote control of a television receiver.

Still another object of the present invention is to reduce the susceptibility of a remote control system to spurious inputs by employing pulse code modulated control signals having frequencies in a relatively noise-free portion of the electromagnetic spectrum.

A still further object of the present invention is to provide for the microcomputer-controlled decoding of digital remote control signals in a television receiver.

BRIEF DESCRIPTION OF THE DRAWINGS

The appended claims set forth those novel features believed characteristic of the invention. However, the invention itself as well as further objects and advantages thereof will best be understood by reference to the following detailed description of a preferred embodiment taken in conjunction with the accompanying drawings, where like reference characters identify like elements throughout the various figures, in which:

FIGS. 5A-5J show the wave forms of the signals present in various portions of the decoder illustrated in FIG. 4.

DESCRIPTION OF THE PREFERRED EMBODIMENTS

The present invention is utilized with a remote control system in which pulse code modulated (PCM) output signals are generated in response to user operated controls. The code consists of a start bit comprised of the first two pulses followed by five groups of three pulses each of a data bit and its complement for control signal verification. The entire code, therefore, consists of 11 bits of information with a single pulse representing a "0" state, while a double pulse represents the "1" state.

The pulses are generated at a frequency in the infrared (IR) spectrum and are chopped by a 40 kHz clock signal. This is done to translate the signal to a higher frequency to avoid the usual spectrum of IR noise which is more predominant at the lower frequencies. The 11 bits are transmitted in approximately a 56 millisecond period which is repeated every 180 milliseconds as long as the transmitter key is depressed. The codes for all transmitted functions have the same period; however, the five bit code generated is unique for each function.

Figure 1:
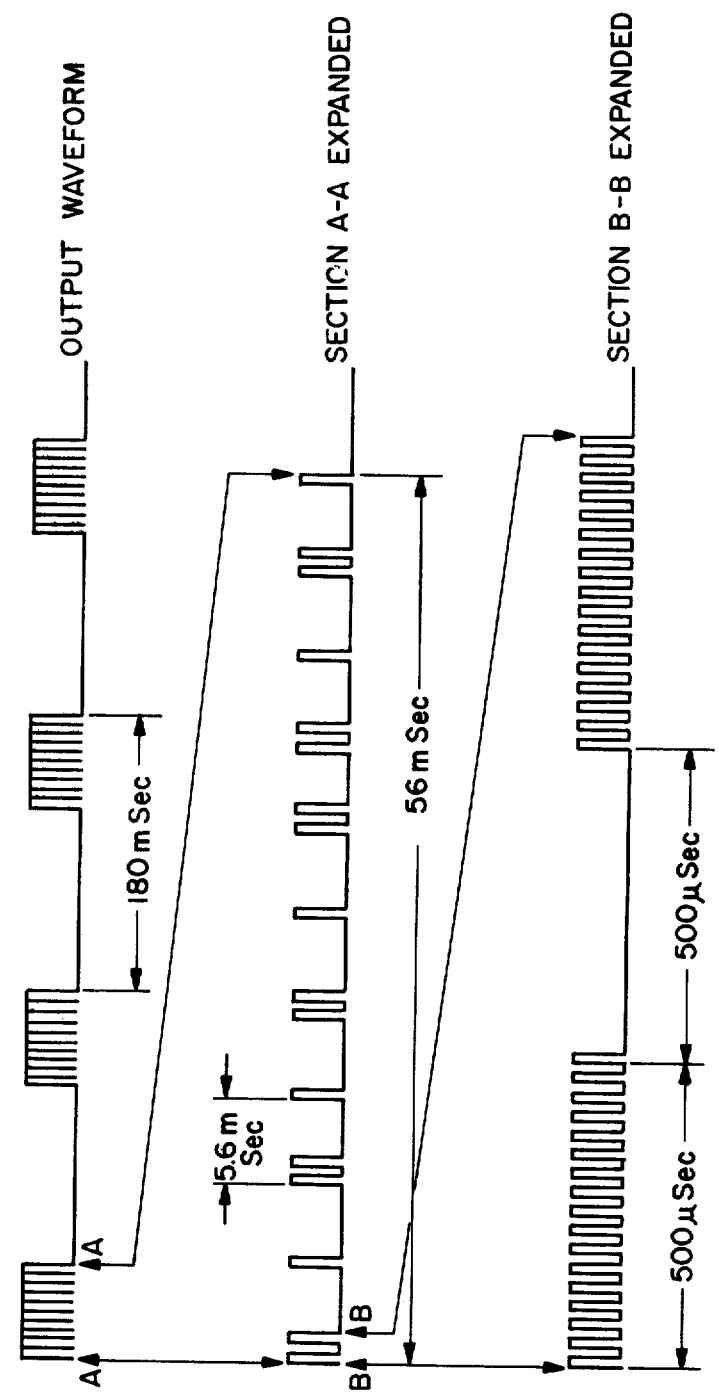
FIGS. 1A-1C depict the pulse trains of the transmitted control signal in the IR remote control system of the present invention, with a single pulse train shown in various degrees of expansion.

Shown in FIG. 1A is the output wave form of the transmitted IR signal which is repeated every 180 milliseconds. Each series of pulses is pulse code modulated as shown in FIG. 1B wherein an individual pulse train is presented in expanded form to show the coded pulse arrangement of the transmitted pulse groups. The 11 bits of coded information are transmitted in approximately 56 milliseconds. Shown in FIG. 1C is a still expanded view of a single data bit comprised of two pulse trains each 500 microseconds in length. A 500 millisecond interval is incorporated between individual pulse trains. The individual pulses shown in FIG. 1C represent the ON/OFF pulsing of the transmitter's light emitting diodes (LEDs). The LEDs are pulsed on and off in order to permit high current pulses at low duty cycles resulting in high power outputs of the I.R. diodes allowing increased range.

Figure 2:
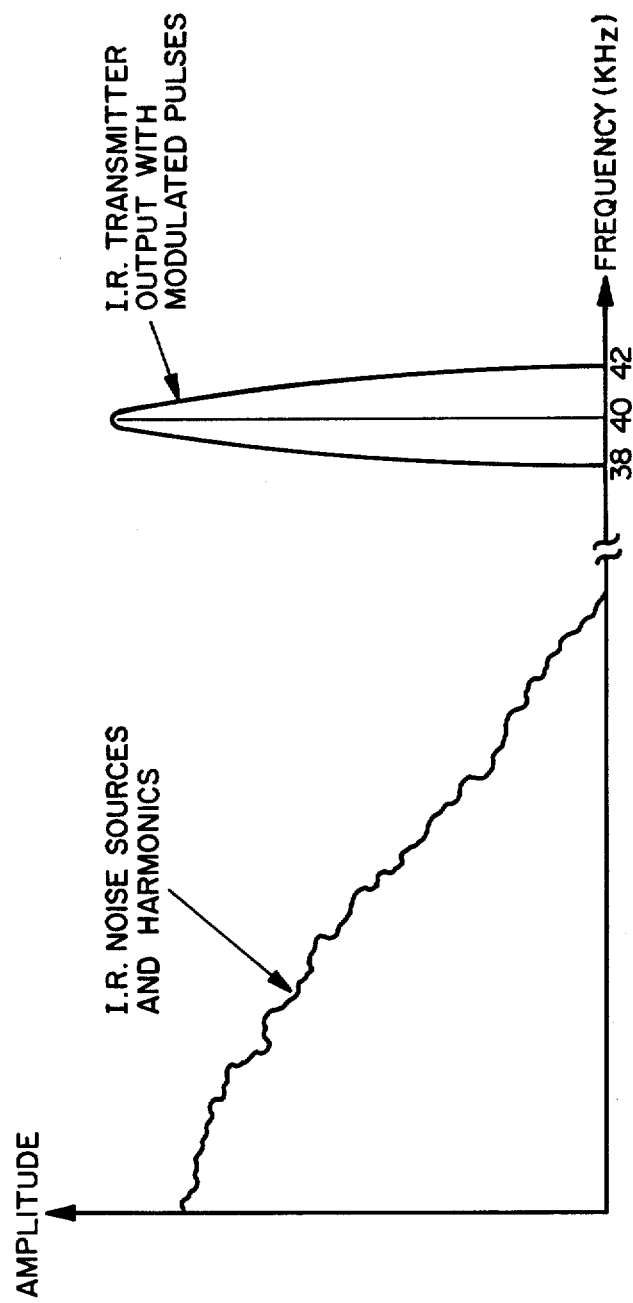
FIG. 2 illustrates the frequency translation of the transmitted control signals in the IR spectrum.

As previously stated, the IR pulses are modulated by a high frequency, i.e., 40 kHz, clock signal in the remote control transmitter. This results in a translation in the transmitted IR signal to a higher frequency in the IR spectrum as shown in FIG. 2. This frequency translation is performed in order to remove the transmitted signal from a noisy portion of the IR spectrum and locate it in a relatively noise-free portion of that frequency spectrum. The plot of IR noise sources and harmonics in FIG. 2 represents various sources of spurious inputs in an IR remote control system, such as fluorescent and incandescent lamps and sunlight. By thus translating the frequency of the PCM control signals to a more noise-free portion of the spectrum, the remote control system of the present invention is made more reliable and receiver signal processing is simplified.

Figure 3:
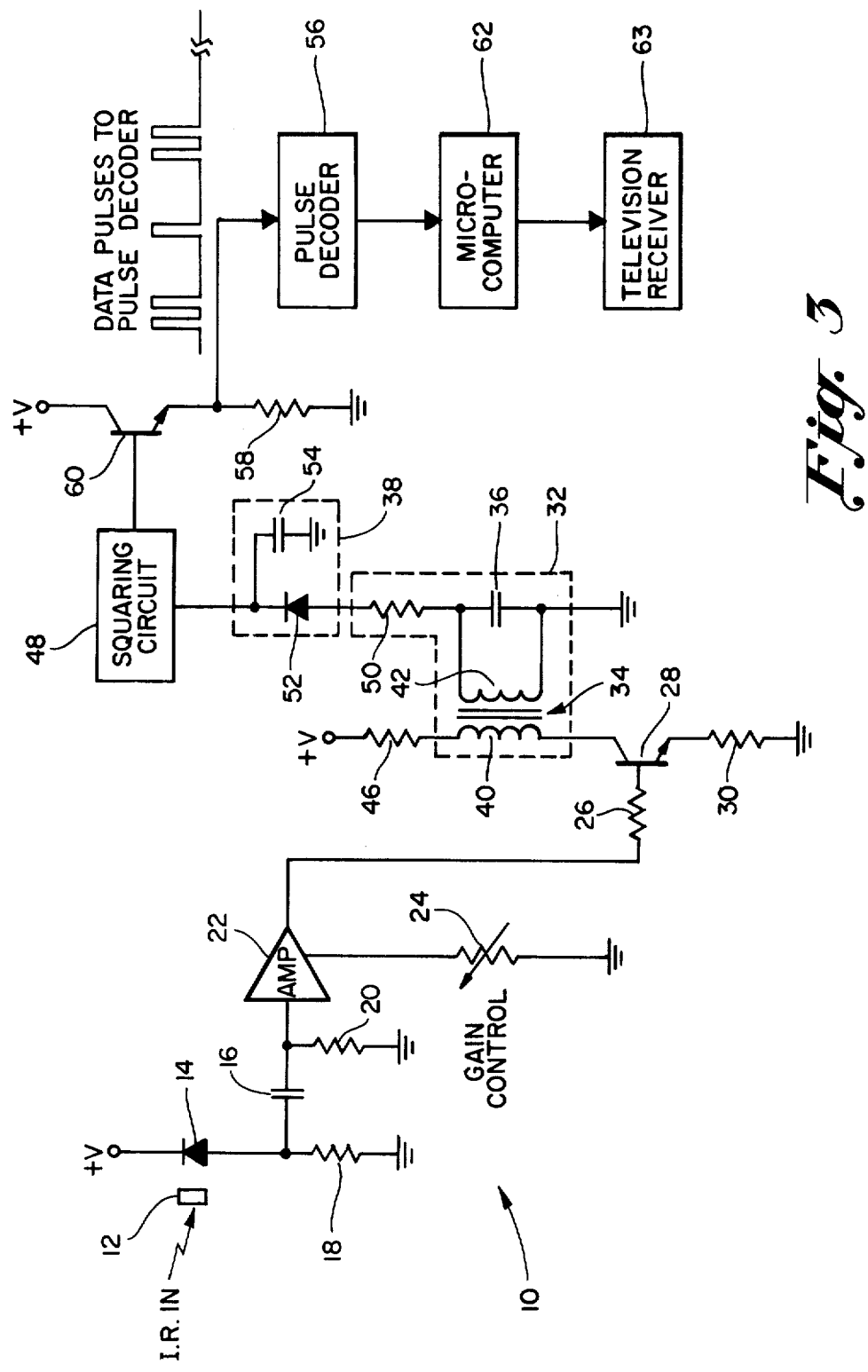
FIG. 3 is a schematic diagram, partly in functional block form, of the detector/preamplifier utilized in a preferred embodiment of the present invention.

Referring to FIG. 3, there is shown in schematic and block diagram form an IR remote control detector/decoder 10 in accordance with the present invention. A transmitted IR control signal is incident upon a photo diode 14 after transiting optical filter 12. Photo diode 14 is reverse biased by means of a +V voltage source for greater sensitivity and is rendered conducting upon receipt of an incident IR signal. Connected to the cathode of photo diode 14 is grounded resistor 18 for proper diode biasing. The output of photo diode 14 is AC coupled by means of capacitor 16 to the input of a high gain amplifier 22 for removing the DC ambient light signal from the received pulsed control input signal. In addition, capacitor 16 in combination with grounded resistor 20 filter out low frequency noise components of the received IR control signal. The gain of amplifier 22 is controlled by means of grounded resistor 24 which in the preferred embodiment of the present invention is a variable resistance.

The output of high gain amplifier 22 is coupled by means of resistor 26 to the base of buffer transistor 28. Transistor 28 provides a buffer between high gain amplifier 22 and band pass filter 32 and, in combination with an emitter grounding resistance 30, further amplifies the control signal input. Resistance 26 provides for proper transistor biasing for transistor 28 and limits the current thereto. The amplified output of transistor 28 is provided to the primary winding 40 of transformer 34 in band pass filter 32. Primary winding 40 is also coupled by means of resistance 46 to the +V power supply. Transformer 34 includes a secondary winding 42 inductively coupled to primary winding 40 for generating an output signal in response to the input control signal provided to primary winding 40. Signal gain may be accomplished in transformer 34 by providing secondary winding 42 with a greater number of turns than that of primary winding 40. In the preferred embodiment of the present invention, the signal gain across transformer 34 is approximately 4 to 1.

Coupled across secondary winding 42 is grounded capacitor 36 which filters out unwanted signal components. Thus, transformer 34 in combination with grounded capacitor 36 and resistor 50 forms a band pass filter network having a transmission frequency centered around 40 kHz which is the rate at which the incoming pulse control signals are modulated. The output of band pass filter 32 is provided to envelope detector 38 which includes diode 52 and grounded capacitor 54. The positive portion of the signal transmitted by band pass filter 32 forward biases diode 52 and renders it conducting. The negative portion of the band pass filter signal reverse biases diode 52, rendering it nonconducting, and it is not transmitted by envelope detector 38. Thus, envelope detector 38 effectively removes the carrier signal from the PCM control signals in providing the base band control signal pulses to squaring circuit 48. Squaring circuit 48 is incorporated to reshape the pulsed output of envelope detector 38 so that the signal provided by squaring circuit 48 to buffer transistor 60 is comprised of well-defined squared pulses similar to those received by photo diode 14. In the preferred embodiment of the present invention, squaring circuit 48 is a conventional Schmidt trigger circuit.

The output of squaring circuit 48 is provided to the base of buffer transistor 60. With the collector of transistor 60 coupled to the +V power supply and its emitter coupled to ground via resistance 58, transistor 60 buffers the output of squaring circuit 48 in providing low impedance data pulses having short rise and fall times to pulse decoder 56. Pulse decoder 56 then processes these serial data control signals, in a manner described below, and provides information regarding the pulse code to microcomputer 62 at a suitable rate allowing microcomputer 62 to process this control data in a conventional manner. Microcomputer 62 then provides control signals to the apparatus to be controlled by means of the IR remote control system of the present invention, which in a preferred embodiment of this invention is a conventional television receiver.

In a preferred embodiment of the present invention, the outputs of microcomputer 62 are provided to the television receiver's tuning system, with which microcomputer 62 may be integrated, in controlling the various functions and operating parameters of the television receiver. Since the processing of the control signals in microcomputer 62 and the interfacing of microcomputer 62 with the control device, such as a television receiver, may be conventional in nature and does not form a part of the present invention, this portion of the present system is not discussed further herein.

Figure 4:
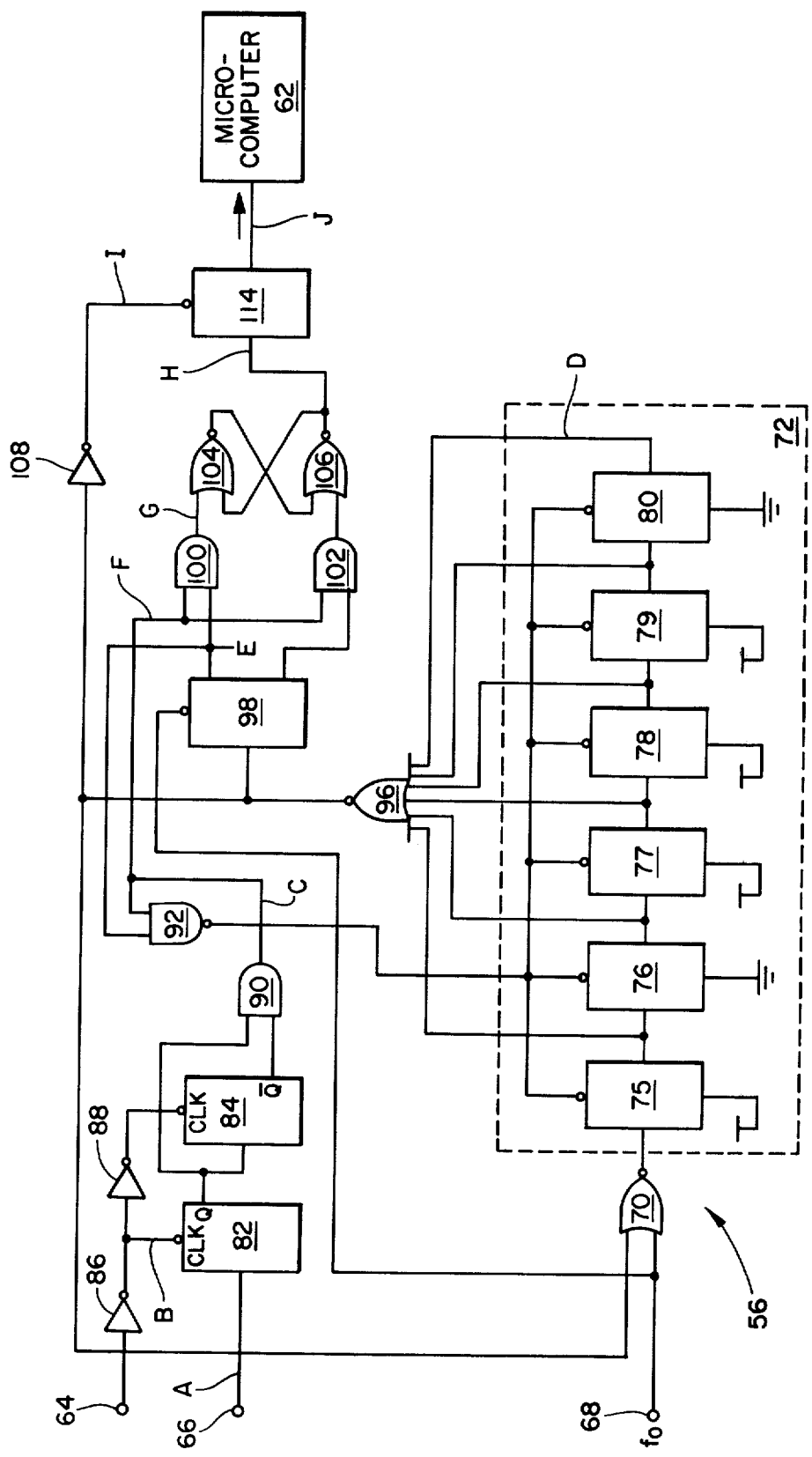
FIG. 4 shows the detailed logic circuitry of a remote control signal decoder utilized in a preferred embodiment of the invention.

Referring to FIG. 4, there is shown a PCM control signal decoder 56 utilized in a preferred embodiment of the present invention. In discussing decoder 56, reference is made to FIGS. 5A–5J wherein are presented the signal levels at various locations in decoder 56. The locations A–J in the decoder 56 of FIG. 4 correspond, respectively, to the signals shown in FIGS. 5A–5J.

The pulsed output of the detector portion of the present invention is provided to input pin 66 of decoder 56. The pulsed control signals on line A are shown in FIG. 5A and are provided to D-type flip-flops 82, 84. A clocking signal is provided via input terminal 64 to inverters 86, 88 as shown in FIG. 5B. In the preferred embodiment of the present invention, this signal is comprised of 150 kHz pulses. The output of flip-flops 82, 84 is provided to AND gate 90, the output of which is provided to NAND gate 92 and to AND gates 100, 102. The output of NAND gate 92 is coupled to and clears D-type flip-flops 75 through 80, the combination of which comprises a counter 72. Thus, a control signal input provided to input pin 66 causes a transition at the $\overline{Q}$ output of flip-flop 84 which initiates a monostable period which is generated by flip-flops 75 through 80.

A 14 kHz clock signal is also provided to input pin 68 of decoder 56 and thence to one input of NOR gate 70. This clock signal is also provided to the clock input of D-type flip-flop 98. The other input to NOR gate 70 is provided by the output of NOR gate 96 which is enabled by the combined Q outputs of flip-flops 75–80. When the output from NOR gate 96 to NOR gate 70 is low and the clock signal provided to input pin 68 toggles up or down, NOR gate 70 is enabled providing an input to the T-input of flip-flop 75. The toggling of flip-flop 75 initiates a chain reaction among the remaining flip-flops in counter 72 such that the clock signal is divided by a predetermined number to provide a pulse output from counter 72 of a predetermined duration. In the preferred embodiment of the present invention, the 14 kHz clock signal provided to input pin 68 is divided by 29 in counter 72 to provide a 2.07 millisecond output from counter 72, as shown in FIG. 5D. Once counter 72 has counted the required time interval, the output of NOR gate 96 to flip-flop 98 is switched.

The output pulse of AND gate 90, as shown in FIG. 5C, is provided to NAND gate 92 which clears and presets counter 72 and is also provided to AND gates 100, 102. The other input to AND gates 100, 102 is provided by D-type flip-flop 98 which is enabled and disabled by the output of counter 72. The output pulse of flip-flop 98 is shown in FIG. 5E and from this it can be seen that only during the 2.07 millisecond interval provided by counter 72 can the output of flip-flop 98 be toggled, or change state. The output of AND gates 100, 102, as shown in FIG. 5G, is determined by the E and F inputs to AND gates 100, 102. When the output of AND gate 90 shown in FIG. 5C is high and the output of flip-flop 98 is high, the outputs of AND gates 100, 102 as shown in FIG. 5G will turn off and on in response to the high states of signals C and G. When the output of flip-flop 98 is high as shown in FIG. 5E, and the output pulses of AND gate 90 as shown in FIG. 5C are high, the outputs G of AND gates 100, 102 are gated through NOR gates 104, 106 to a D-type flip-flop 114. Thus, an incoming control signal pulse provided to input pin 66 sets flip-flop 84 and initiates the counting of a predetermined time interval by counter 72. If a second pulse is received by input pin 66 during this interval, flip-flop 84 is reset. With the timing interval, signal from counter 72 provided to AND gates 100, 102 by NOR gate 96 and a control signal input provided to AND gates 100, 102 by flip-flop 98, the state of output flip-flop 114 is determined by whether or not a control signal input was received during the predetermined time interval. This is how decoder 56 determines whether one or two pulses, a binary "0" or a binary "1", was provided to input pin 66.

Coupled NOR gates 104, 106 in combination form an RS flip-flop and are responsive to the outputs of AND gates 100, 102 as shown in FIG. 5G. The pulsed output of NOR gates 104, 106 is shown in FIG. 5H and from this it can be seen that the output of NOR gates 104, 106 is reset when the output of AND gate 90 momentarily goes low as shown in FIG. 5C in setting counter 72. When the output of NOR gates 104, 106 is high and the clock input thereto as provided via inverter 108 from NOR gate 96 goes high, then the output of the D-type output flip-flop 114 begins clocking control data into the microcomputer 62 where this data is processed in a conventional manner. Thus, a high output from flip-flop 114 represents a double pulse input, or a binary "1", while a low output from flip-flop 114 represents a single pulse input, or a binary "0".

There has thus been shown a detector/decoder for processing pulse code modulated infrared remote control signals in which the control pulses are modulated by means of a high frequency clock signal in translating the transmitted signal to a higher frequency, more noise immune portion of the IR spectrum. The present invention detects and decodes these pulse code modulated signals and provides these user initiated commands in the form of a conventional data pulse train to a microcomputer which, in turn, directly controls the remotely controlled apparatus, such as a conventional television receiver.

While particular embodiments of the present invention have been shown and described, it will be apparent to those skilled in the art that changes and modifications may be made therein without departing from the invention in its broader aspects. The aim of the appended claims, therefore, is to cover all such changes and modifications as fall within the true spirit and scope of the invention.

We claim:

1. In an infrared remote control receiver for processing pulse code modulated control signals generated in response to user selected inputs and modulated by a high frequency carrier signal in translating said control signals to a higher frequency for remotely controlling a plurality of functions in a controlled apparatus by means of a microcomputer responsive to said control signals, a signal detector/decoder comprising:

light detecting means for receiving a remote control signal transmitted by infrared radiation;

a band pass filter tuned to the frequency of said carrier signal and coupled to said light detecting means for filtering said received control signals;

envelope detection means coupled to said band pass filter for demodulating said carrier signal and for recovering said pulse code modulated control signals; and signal decoding means coupled to said envelope detection means for decoding said pulse code modulated control signals and providing the thus decoded control signals to said microcomputer for controlling said apparatus;

wherein said control signal includes an initialization pulse with said signal decoding means responsive to said initialization pulse for generating and providing a sampling interval signal to said microcomputer and wherein said signal decoding means decodes said pulse code modulated control signals and provides the thus decoded control signals to said microcomputer during said sampling interval.

2. A signal detector/decoder as described in claim 1 wherein said controlled apparatus comprises a television receiver including a tuning system coupled to and responsive to the control signal-initiated outputs of said microcomputer.

3. A signal detector/decoder as described in claim 1 wherein said signal decoder means includes an input latch coupled to said envelope detector and responsive to said pulse code modulated control signal for a predetermined time period following receipt of said initialization pulse, an output latch coupled to said microcomputer for providing said decoded control signals thereto and logic control circuitry coupling said input and output latches for decoding said pulse code modulated control signals and providing a latching signal representative thereof to said output latch.

4. A signal detector/decoder as described in claim 3 wherein said logic control circuitry includes counting means coupled to said input latch and responsive to the state thereof for providing a predetermined delay between the receipt of said initialization pulse by said input latch and the transmission of said decoded control signals by said output latch to said microcomputer.

5. A signal detector/decoder as described in claim 1 wherein said light detecting means comprises a photo diode responsive to infrared radiation incident thereon in combination with an optical filter through which said infrared radiation is transmitted prior to being incident upon said light detecting means.

6. In an infrared remote control receiver for processing a pulse code modulated control signal generated in response to user selected inputs and modulated by a high frequency carrier signal in translating said control signal to a higher frequency for remotely controlling a plurality of functions in a controlled apparatus by means of a microcomputer responsive to said control signal, said control signal including an initialization pulse, a signal detector/decoder comprising:

light detecting means for receiving a remote control signal transmitted by infrared radiation, said light detecting means including a photo diode responsive to infrared radiation incident thereon in combination with an optical filter through which said infrared radiation is transmitted prior to being incident upon said light detecting means;

a band pass filter tuned to the frequency of said carrier signal and coupled to said light detecting means for filtering said received control signals, said band pass filter including a transformer having a primary winding coupled to said light detecting means and a secondary winding, wherein a grounded capacitor is coupled across said secondary winding;

envelope detection means coupled to the secondary winding of said band pass filter for receiving the filtered output therefrom, demodulating said carrier signal, and recovering said pulse code modulated control signals; and signal decoding means coupled to said envelope detection means for decoding said pulse code modulated control signals and providing the thus decoded control signals to said microcomputer for controlling said apparatus, and wherein said signal decoding means is responsive to said initialization pulse for generating and providing a sampling interval signal to said microcomputer with said decoded control signals provided to said microcomputer during said sampling interval.

7. In an infrared remote control receiver for processing pulse code modulated control signals generated in response to user selected inputs and modulated by a high frequency carrier signal in translating said control signals to a higher frequency for remotely controlling a plurality of functions in a television receiver by means of a microcomputer responsive to said control signals, a signal detector/decoder comprising:

light detecting means for receiving a remote control signal transmitted by infrared radiation;

a band pass filter tuned to the frequency of said carrier signal and coupled to said light detecting means for filtering said received control signals, said band pass filter including a transformer having a primary winding coupled to said light detecting means and a secondary winding, wherein a grounded capacitor is coupled across said secondary winding;

envelope detection means coupled to the secondary winding of said band pass filter for receiving the filtered output therefrom, demodulating said carrier signal, and recovering said pulse code modulated control signals; and signal decoding means coupled to said envelope detection means for decoding said pulse code modulated control signals and providing the thus decoded control signals to said microcomputer for controlling said television receiver, said signal decoding means including:

an input latch coupled to said envelope detection means and responsive to said pulse code modulated control signals;

an output latch coupled to said microcomputer for providing said decoded control signals thereto; and logic control circuitry coupling said input and output latches for decoding said pulse code modulated control signals and providing a latching signal representative thereof to said output latch, said logic control circuitry including counting means coupled to said latch and responsive to the state thereof for providing a predetermined delay between the receipt of said initialization pulse by said input latch and the transmission of said decoded control signals by said output latch to said microcomputer.

* * * * *